(12) United States Patent
Kang

(10) Patent No.: US 11,906,837 B2
(45) Date of Patent: Feb. 20, 2024

(54) PICTURE GENERATION APPARATUS

(71) Applicant: HYUNDAI MOBIS CO., LTD., Seoul (KR)

(72) Inventor: Hyun Woo Kang, Seongnam-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 10 days.

(21) Appl. No.: 18/055,329

(22) Filed: Nov. 14, 2022

(65) Prior Publication Data
US 2023/0258971 A1 Aug. 17, 2023

(30) Foreign Application Priority Data
Feb. 14, 2022 (KR) .......................... 10-2022-0019176

(51) Int. Cl.
*G02F 1/1333* (2006.01)
*H05K 7/20* (2006.01)
*G02F 1/13357* (2006.01)

(52) U.S. Cl.
CPC .. *G02F 1/133385* (2013.01); *G02F 1/133322* (2021.01); *G02F 1/133606* (2013.01); *H05K 7/20963* (2013.01)

(58) Field of Classification Search
None
See application file for complete search history.

(56) References Cited

FOREIGN PATENT DOCUMENTS

| CN | 109648818 A | * | 4/2019 | .......... B29C 55/143 |
| JP | 2020189605 A | * | 11/2020 | |
| KR | 20210144182 A | * | 11/2021 | |

* cited by examiner

*Primary Examiner* — Phu Vu
(74) *Attorney, Agent, or Firm* — DLA Piper LLP (US)

(57) ABSTRACT

A picture generation apparatus includes: a PCB on which one or more light sources are disposed; an LCD projecting an image using light that is emitted from the one or more light sources; a diffuser disposed between the PCB and the LCD; and a screen configured to be in contact with at least a portion of the LCD and discharge heat generated from the LCD.

12 Claims, 3 Drawing Sheets

PICTURE GENERATION APPARATUS

CROSS-REFERENCE TO RELATED APPLICATION

The present application is based on and claims the benefit of priority to Korean Patent Application Number 10-2022-0019176, filed on Feb. 14, 2022 in the Korean Intellectual Property Office, the entire disclosure of which is incorporated herein by reference.

TECHNICAL FIELD

The present disclosure relates to a picture generation apparatus.

BACKGROUND

The description of this part only provides the background information of the present disclosure without configuring the related art.

A head-up display (HUD) is a device that enables a driver to see the current speed, navigation, a fuel amount, and various items of information related to driving of a vehicle by showing the information on the windshield of the vehicle. Since a driver can easily see various items of information related to driving of a vehicle using a head-up display, the driver can look at the front area with a less distributed viewpoint even during driving.

A head-up display may include a case having an accommodation space formed therein, a picture generation unit that projects an image related to driving information of a vehicle, a reflection member, a dust cover, etc. A head-up display is installed under the windshield of a vehicle for the characteristics.

The picture generation unit may include a light source, a printed circuit board (PCB) on which the light source is disposed, a liquid crystal display (LCD) that projects an image, a lens that uniformly concentrates light transmitted from the light source, a diffuser that uniformly diffuses light to the LCD, etc.

The LCD that protects an image related to driving information of a vehicle absorbs heat due to the sunlight traveling inside through a windshield, the heat generated by the light source, etc. When the LCD is continuously exposed to high temperatures, the LCD is deteriorated and the reliability may decrease.

In the related art, the rotation structure of an aspherical lens using a separate illumination sensor, etc. have been applied to solve this problem. However, there is a problem that since the aspherical lens, etc. are rotated during driving, a fail-safe function or a driver may recognize it as malfunction of the device. Accordingly, it is required to improve reliability by efficiently preventing deterioration of an LCD without influencing an image related to driving information of a vehicle.

SUMMARY

A picture generation apparatus according to an embodiment can efficiently prevent deterioration of an LCD and secure reliability through disposing a screen made of a heat dissipation plastic material in contact with the LCD.

The objectives of the present disclosure are not limited to the objectives described above and other objectives will be clearly understood by those skilled in the art from the following description.

According to an embodiment of the present disclosure, a picture generation apparatus comprising: a PCB on which one or more light sources are disposed; an LCD projecting an image using light that is emitted from the one or more light sources; a diffuser disposed between the PCB and the LCD; and a screen configured to be in contact with at least a portion of the LCD and discharge heat generated from the LCD is provided.

According to an embodiment, the picture generation apparatus has an effect of efficiently preventing deterioration of an LCD and securing reliability because a screen made of a heat-resistant plastic material is disposed in contact with the LCD.

DETAILED DESCRIPTION

Figure 1:
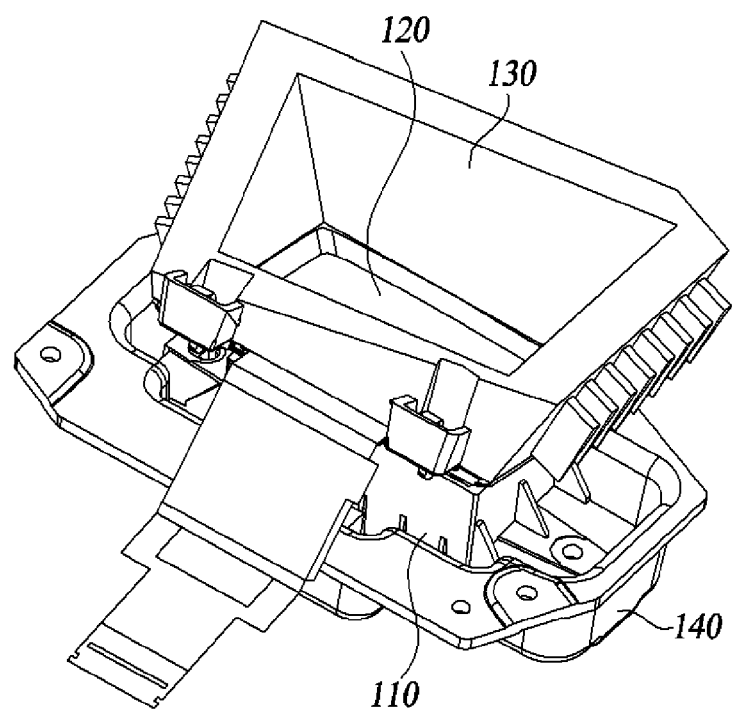
FIG. 1 is a perspective view of a picture generation apparatus according to an embodiment of the present disclosure.

Hereinafter, some exemplary embodiments of the present disclosure will be described in detail with reference to the accompanying drawings. In the following description, like reference numerals preferably designate like elements, although the elements are shown in different drawings. Further, in the following description of some embodiments, a detailed description of known functions and configurations incorporated therein will be omitted for the purpose of clarity and for brevity.

Additionally, various terms such as first, second, A, B, (a), (b), etc., are used solely to differentiate one component from the other but not to imply or suggest the substances, order, or sequence of the components. Throughout this specification, when a part 'includes' or 'comprises' a component, the part is meant to further include other components, not to exclude thereof unless specifically stated to the contrary. The terms such as 'unit', 'module', and the like refer to one or more units for processing at least one function or operation, which may be implemented by hardware, software, or a combination thereof.

FIG. 1 is a perspective view of a picture generation apparatus according to an embodiment of the present disclosure.

Figure 2:
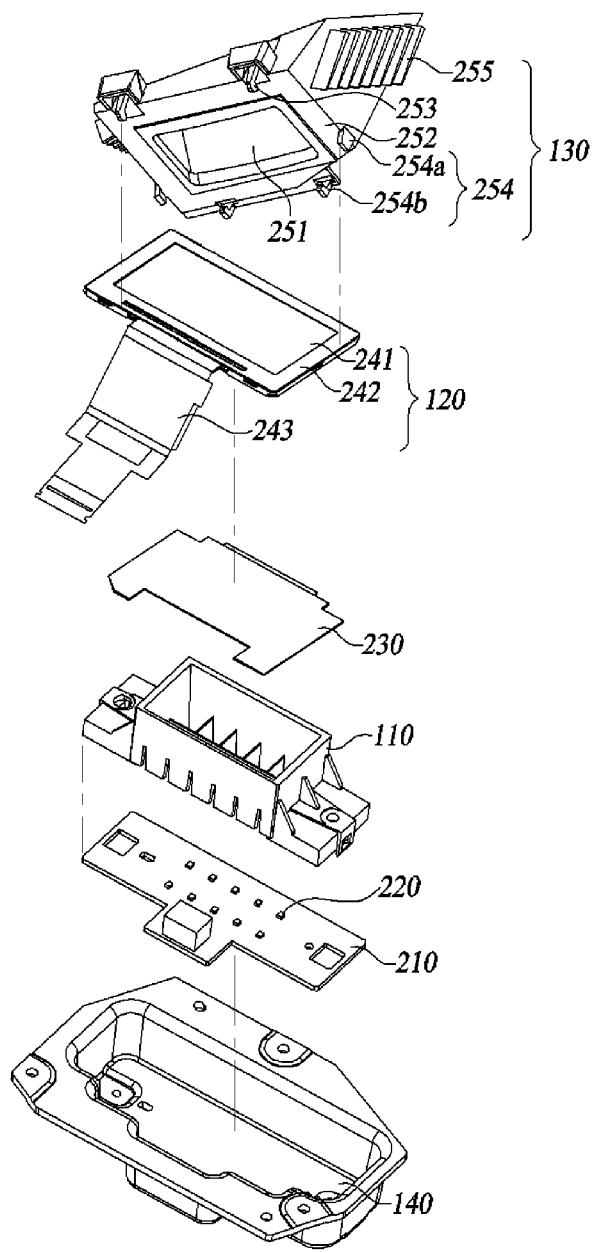
FIG. 2 is an exploded perspective view of the picture generation apparatus according to an embodiment of the present disclosure.

FIG. 2 is an exploded perspective view of the picture generation apparatus according to an embodiment of the present disclosure.

Figure 3:
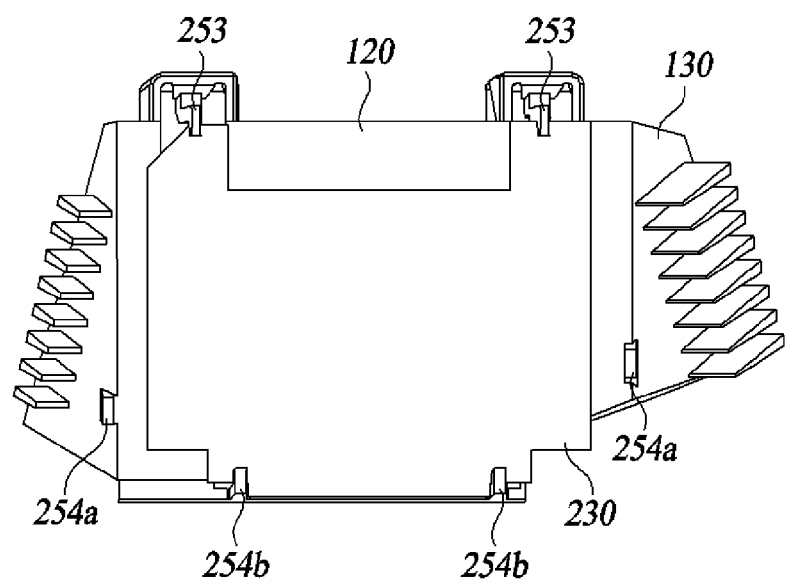
FIG. 3 is a view showing a combination structure of a screen, an LCD, and a diffuser according to an embodiment of the present disclosure.

FIG. 3 is a view showing a combination structure of a screen, an LCD, and a diffuser according to an embodiment of the present disclosure.

Referring to FIGS. 1 to 3, a picture generation apparatus 100 according to an embodiment of the present disclosure may include a printed circuit board (PCB) 210, a light source 220, a funnel 110, a diffuser 230, a liquid crystal display (LCD) 120, a screen 130, and a heat sink 140.

The LCD 120 may include a display unit 241, an edge unit 242, and a fixing unit 243.

The screen 130 may include a penetration unit 251, a contact unit 252, a fixing member 253, a guiding member 254, and a heat dissipation fin 255.

The guiding member 254 may include a first guiding member 254a and a second guiding member 254b.

One or more light sources 220 may be disposed on the PCB 210. The PCB 210 may be disposed in an accommodation space inside the heat sink 140. The PCB 210 may be disposed behind the funnel 110 with respect to a traveling path of light emitted from the light source 220. The PCB 210 may be disposed to be in contact with at least a portion of the funnel 110.

The light source 220, which is a member that emits light, may be disposed on the PCB 210. The light source 220 may include a plurality of light sources. The light source 220 may be a light emitting diode (LED). A plurality of light sources 220 may be disposed in a predetermined pattern on the PCB 210. Light emitted from the light source 220 may travel through the funnel 110 and the diffuser 230 into the rear of the LCD 120. The LCD 120 projects an image using light emitted from the light source 220.

The funnel 110 may be disposed ahead of the PCB where the light source 220 is disposed. The funnel 110 may be disposed behind the LCD 120 and the diffuser 230. The funnel 110 may be disposed in the accommodation space inside the heat sink 140. The funnel 110 guides the traveling path of light such that light emitted from the light source 220 uniformly travels into the diffuser 230 and the LCD 120. The inside of the funnel 110 may be formed in a cup shape to guide the traveling path of light emitted from the light source 220.

The diffuser 230 is disposed behind the LCD 120. The diffuser 230 may be disposed between the PCB 210 and the LCD 120. The diffuser 230 may include a plurality of diffusers. The diffuser 230 diffuses light such that light emitted from the light source 220 uniformly travels into the rear of the LCD 120. At least one of a plurality of diffusers 230 may be coupled to the LCD 120 and the screen 130 using the fixing member 253. The position at which the diffuser 230 is mounted on the screen 130 may be guided by the second guiding member 254b. At least a portion of the diffuser 230 may be formed to be stepped. The stepped portion of the diffuser 230 is inserted between two second guiding members 254b formed to be spaced apart from each other, whereby the mounting position of the diffuser 230 can be determined. The diffuser 230 may be manufactured to have a shape and dimensions corresponding to at least a portion of the LCD 120.

The LCD 120 may be disposed between the diffuser 230 and screen 130. The LCD 120 projects an image using light emitted from the light source 220. The LCD 120 can absorb heat that transfers from the light source 220. The LCD 120 can generate heat. The heat generated from the LCD 120 can transfer to the screen 130. The LCD 120 may be disposed with at least a portion in contact with the screen 130.

The display unit 241 is formed in at least a portion of the LCD 120. The display unit 241 projects an image using light emitted from the light source 220. The display unit 241 projects an image using light traveling to the rear of the LCD 120. The display unit 241 may be formed in a shape corresponding to the shape of the penetration unit 251 of the screen 130. Heat may be generated from the display unit 241.

The edge unit 242 is formed to surround the display unit 241. The edge unit 242 may be disposed in face contact with at least a portion of the screen 130. The edge unit 242 may be disposed in contact with the contact unit 252 of the screen 130. The edge unit 242 can transmit heat generated from the display unit 241 to the screen 130.

The fixing unit 243 may be configured such that a first side is connected with at least a portion of the edge unit 242. A second side of the fixing unit 243 may be connected with another component such as a cover, a housing, etc. of a head-up display. The picture generation apparatus 100 may be installed inside a head-up display using the fixing unit 243.

The screen 130 may be configured to be in contact with at least a portion of the LCD 120 and discharge heat generated from the LCD 120 to the outside. The screen 130 may be disposed ahead of the LCD 120. In order to discharge heat transferred from the LCD 120 to the outside well, at least a portion of the screen 130 may be made of a heat dissipation plastic material. In this case, heat conductivity of the heat dissipation plastic may be 15 W/mK or more, and preferably, 20 W/mK or more. A heat resistance temperature of the heat dissipation plastic may be 130° C. or more. Flexural strength of the heat dissipation plastic may be 1000 kgf/cm$^2$ or more.

The penetration unit 251 is formed in at least a portion of the screen 130. The penetration unit 251 may be formed in a shape corresponding to the shape of the display unit 241 of the LCD 120. The penetration unit 251 may be formed such that an image projected from the display unit 241 passes through the penetration unit 251.

The contact unit 252 may be formed to surround the penetration unit 251. The contact unit 252 may be formed in a shape corresponding to the shape of the edge unit 242 of the LCD 120. The contact unit 252 may be disposed in face contact with the edge unit 242. Heat generated from the display unit 241 can transfer to the screen 130 through the edge unit 242 and the contact unit 252. The fixing member 253 and the guiding member 254 may be formed in at least a portion of the contact unit 252.

The fixing member 253 may be formed to protrude from a surface of the screen 130. The fixing member 253 may include a plurality of fixing members. A plurality of fixing members 253 may be formed to be spaced apart from each other. The fixing member 253 may be configured to fix at least one of the LCD 120 and the diffuser 230 on the screen 130. The fixing member 253 may be formed in a hook shape.

The guiding member 254 is configured to guide the position at which the LCD 120 and/or the diffuser 230 is mounted on the screen 130. The guiding member 254 may be formed to protrude from a surface of the screen 130. The guiding member 245 may include a plurality of guiding members. A plurality of guiding members 254 may be formed to be spaced apart from each other. The guiding member 254 may be formed in a protruding shape.

The guiding member 254 may include a first guiding member 254a and a second guiding member 254b. The first guiding member 254a can guide a mounting position of the LCD 120. The second guiding member 254b can guide a mounting position of the diffuser 230. The LCD 120 is inserted between two first guiding members 254a formed to be spaced apart from each other, whereby the mounting position of the LCD 120 can be determined. At least a portion of the diffuser 230 is inserted between two second guiding members 254b formed to be spaced apart from each other, whereby the mounting position of the diffuser 230 can be determined.

The heat dissipation fin 255 may be formed in at least a portion of the screen 130. The heat dissipation fin 255 may be formed to protrude from a surface of the screen 130 and may include a plurality of heat dissipation fins. Since the heat dissipation fin 255 is formed on the screen 130, the heat transferred from the LCD 120 to the screen 130 can be discharged well to the outside.

The heat sink 140 may include an accommodation space therein. The heat sink 140 may be configured to accommodate the PCB 210, the light source 220, the funnel 110, etc. The heat sink 140 may be disposed behind the PCB 210. The heat sink 140 may be configured to discharge heat that is generated from the light source 220 and/or heat inside the picture generation apparatus 100 to the outside. The heat sink 140 may be made of an aluminum (Al) material. The heat sink 140 may be made of Al 1050. The heat sink 140 may be manufactured through deep drawing.

Although exemplary embodiments of the present disclosure have been described for illustrative purposes, those skilled in the art will appreciate that various modifications, additions, and substitutions are possible, without departing from the idea and scope of the claimed invention. Therefore, exemplary embodiments of the present disclosure have been described for the sake of brevity and clarity. The scope of the technical idea of the present embodiments is not limited by the illustrations. Accordingly, one of ordinary skill would understand that the scope of the claimed invention is not to be limited by the above explicitly described embodiments but by the claims and equivalents thereof.

What is claimed is:

1. A picture generation apparatus comprising:
    a printed circuit board (PCB) on which one or more light sources are disposed;
    a liquid crystal display (LCD) projecting an image using light that is emitted from the one or more light sources;
    a diffuser disposed between the PCB and the LCD; and
    a screen having a heat dissipation fin, the screen being configured to be in contact with at least a portion of the LCD and discharge heat generated from the LCD to outside the apparatus using the heat dissipation fin.

2. The picture generation apparatus of claim 1, wherein the LCD includes:
    a display unit projecting the image; and
    an edge unit formed to surround the display unit,
    the screen being configured to be in contact with the edge unit.

3. The picture generation apparatus of claim 1, wherein the screen includes one or more fixing members configured to fix at least one of the LCD or the diffuser to the screen.

4. The picture generation apparatus of claim 3, wherein the one or more fixing members are formed in hook shapes.

5. The picture generation apparatus of claim 1, wherein the screen includes one or more guiding members configured to guide positions at which the LCD and the diffuser are mounted on the screen.

6. The picture generation apparatus of claim 5, wherein the one or more guiding members are formed in protruding shapes.

7. The picture generation apparatus of claim 1, wherein the screen is made of a heat dissipation plastic material.

8. The picture generation apparatus of claim 7, wherein thermal conductivity of the heat dissipation plastic is 15 W/mK or greater.

9. The picture generation apparatus of claim 7, wherein a heat resistance temperature of the heat dissipation plastic is 130° C. or greater.

10. The picture generation apparatus of claim 1, further comprising a heat sink disposed behind and surrounding the PCB.

11. The picture generation apparatus of claim 10, wherein the heat sink is made of an aluminum material.

12. The picture generation apparatus of claim 10, wherein the heat sink is manufactured through deep drawing.

\* \* \* \* \*